United States Patent
Li

(10) Patent No.: US 9,741,964 B2
(45) Date of Patent: Aug. 22, 2017

(54) FRAMELESS DISPLAY DEVICE WITH CONCEALED DRIVE CIRCUIT BOARD AND MANUFACTURING METHOD THEREOF

(71) Applicant: Shenzhen China Star Optoelectronics Technology Co., Ltd., Shenzhen (CN)

(72) Inventor: Wenhui Li, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/764,579

(22) PCT Filed: Jun. 23, 2015

(86) PCT No.: PCT/CN2015/082025
§ 371 (c)(1),
(2) Date: Jul. 30, 2015

(87) PCT Pub. No.: WO2016/183899
PCT Pub. Date: Nov. 24, 2016

(65) Prior Publication Data
US 2016/0336540 A1    Nov. 17, 2016

(30) Foreign Application Priority Data

May 15, 2015 (CN) .......................... 2015 1 0251385

(51) Int. Cl.
| | | |
|---|---|---|
| *H01L 29/08* | (2006.01) |
| *H01L 51/52* | (2006.01) |
| *H01L 51/56* | (2006.01) |
| *H01L 25/16* | (2006.01) |
| *H01L 51/00* | (2006.01) |
| *H01L 27/32* | (2006.01) |

(52) U.S. Cl.
CPC ........ *H01L 51/5253* (2013.01); *H01L 25/167* (2013.01); *H01L 27/3297* (2013.01); *H01L 51/0021* (2013.01); *H01L 51/5203* (2013.01); *H01L 51/56* (2013.01); *H01L 51/0097* (2013.01); *H01L 2251/5315* (2013.01); *H01L 2251/5338* (2013.01)

(58) Field of Classification Search
CPC .......................... H01L 51/5253; H01L 25/167
See application file for complete search history.

*Primary Examiner* — Caleb Henry
(74) *Attorney, Agent, or Firm* — Leong C. Lei

(57) ABSTRACT

The present invention provides a frameless display device and a manufacturing method thereof, in which a conductive connection body is formed on a substrate; a first via is formed in a protective layer to be located above the conductive connection body and a second via hole is formed in the substrate to be located under the conductive connection body. A circuit layout layer is connected through the first via with the conductive connection body and a flexible connection circuit connected to a drive circuit board is connected through the second via with the conductive connection body thereby achieving electrical connection between the drive circuit board and the circuit layout layer. The method is simple and easy to operate and in a frameless display device so manufactured, the flexible connection circuit and the drive circuit board are both arranged at a back side of the substrate without occupying an effective display zone thereby achieving frameless displaying and improving displaying quality.

5 Claims, 4 Drawing Sheets

U.S. 9,741,964 B2

FRAMELESS DISPLAY DEVICE WITH CONCEALED DRIVE CIRCUIT BOARD AND MANUFACTURING METHOD THEREOF

BACKGROUND OF THE INVENTION

1. Field of the Invention

The present invention relates to the field of displaying technology, and in particular to a frameless display device and a manufacturing method thereof.

2. The Related Arts

With progress of the display industry, frameless displaying technology is becoming an important direction of the future development of the field of displaying. A conventional display device is illustrated in FIG. 1 and comprises an upper substrate 100, a lower substrate 200, sealing resin 300 sealing between the upper substrate 100 and the lower substrate 200, and a drive circuit board 400 that is electrically connected by a flexible connection circuit 410 to the lower substrate 200, wherein the lower substrate 200 comprises a first base plate 210 and a circuit layout layer 230 formed on the first base plate 210. The upper substrate 100 is arranged to face the surface of the lower substrate 200 on which the circuit layout layer 230 is formed. The drive circuit board 400 is arranged adjacent to the surface of the first base plate 210 that is distant from the circuit layout layer 230 and is electrically connected via the flexible connection circuit 410 to the circuit layout layer 230.

In the above-described display device, the circuit layout layer 230 of the lower substrate 200 necessarily comprises a connection zone specifically for connection with the flexible connection circuit 410. Since the connection zone does not provide effective displaying and takes a certain width, an area of a frame or bezel of the display device is increased and an effective display zone is reduced. Further, since the flexible connection circuit 410 has an end that is connected with the circuit layout layer 210 formed on an upper surface of the lower substrate 200 and an opposite end that is connected to a drive circuit board 300 located on the side of the lower surface of the lower substrate 200, the flexible connection circuit 410 must be set around an edge of the lower substrate 200 and shows a U-shaped configuration. Since the flexible connection circuit 410 occupies a certain amount of space at the edge of the lower substrate 200, the frame area of the display device is further expanded, making it hard for the conventional display device to achieve slim-bezel displaying and even harder to achieve frameless displaying.

SUMMARY OF THE INVENTION

An object of the present invention is to provide a frameless display device, in which a flexible connection circuit and a drive circuit board are both arranged at a back side of a substrate without occupying an effective display zone so as to achieve frameless displaying and improving displaying quality.

An object of the present invention is also to provide a manufacturing method of a frameless display device, in which a conductive connection body is formed on a substrate; a first via is formed in a protective layer to be located above the conductive connection body and a second via hole is formed in the substrate to be located under the conductive connection body. A circuit layout layer is connected through the first via with the conductive connection body and a flexible connection circuit connected to a drive circuit board is connected through the second via with the conductive connection body thereby achieving electrical connection between the drive circuit board and the circuit layout layer. The method is simple and easy to operate and in a frameless display device so manufactured, the flexible connection circuit and the drive circuit board are both arranged at a back side of the substrate without occupying an effective display zone thereby achieving frameless displaying and improving displaying quality.

To achieve the above objects, the present invention provides a frameless display device, which comprises a substrate, a conductive connection body formed on the substrate, a protective layer formed on the conductive connection body, a circuit layout layer formed on the protective layer, an organic light emitting diode (OLED) emission layer or a package layer formed on the circuit layout layer, and a drive circuit board adjacent to a side of the substrate that is distant from the conductive connection body and is connected through a flexible connection circuit with the conductive connection body;

wherein the protective layer comprises a first via formed therein to be located above and correspond to the conductive connection body and the circuit layout layer is set in engagement with and electrically connected to the conductive connection body through the first via; and the substrate comprises a second via formed therein to be located under and correspond to the conductive connection body and the flexible connection circuit has an end electrically connected to the drive circuit board and an opposite end extending from an underside of the substrate through the second via to contact and electrically connect with the conductive connection body so as to achieve electrical connection between the drive circuit board and the circuit layout layer.

The conductive connection body is set in a middle area of the substrate.

The substrate is a flexible substrate.

The conductive connection body comprises a material of metal.

The frameless display device is a top emission OLED display device.

The present invention also provides a frameless display device, which comprises a substrate, a conductive connection body formed on the substrate, a protective layer formed on the conductive connection body, a circuit layout layer formed on the protective layer, an organic light emitting diode (OLED) emission layer or a package layer formed on the circuit layout layer, and a drive circuit board adjacent to a side of the substrate that is distant from the conductive connection body and is connected through a flexible connection circuit with the conductive connection body;

wherein the protective layer comprises a first via formed therein to be located above and correspond to the conductive connection body and the circuit layout layer is set in engagement with and electrically connected to the conductive connection body through the first via; and the substrate comprises a second via formed therein to be located under and correspond to the conductive connection body and the flexible connection circuit has an end electrically connected to the drive circuit board and an opposite end extending from an underside of the substrate through the second via to contact and electrically connect with the conductive connection body so as to achieve electrical connection between the drive circuit board and the circuit layout layer;

wherein the conductive connection body is set in a middle area of the substrate;

wherein the substrate is a flexible substrate; and wherein the conductive connection body comprises a material of metal.

The present invention further provides a manufacturing method of a frameless display device, which comprises the following steps:

(1) providing a substrate and forming a conductive connection body on the substrate;

(2) depositing and patterning a protective layer on the substrate and the conductive connection body, forming a first via in the protective layer to be located above and correspond to the conductive connection body, forming a circuit layout layer on the protective layer, so that the circuit layout layer is set in engagement with and electrically connected to the conductive connection body through the first via;

(3) forming an organic light emitting diode (OLED) emission layer or a package layer on the circuit layout layer;

(4) forming a second via in the substrate through laser holing to be located under and correspond to the conductive connection body; and (5) providing a drive circuit board and a flexible connection circuit and arranging the drive circuit board and the flexible connection circuit adjacent to one side of the first substrate that is distant from the circuit layout layer, wherein the flexible connection circuit has an end electrically connected to the drive circuit board and an opposite end extending from an underside of the substrate through the second via to engage and electrically connect with the conductive connection body so as to be connected by the conductive connection body to the circuit layout layer to achieve electrical connection between the drive circuit board and the circuit layout layer.

The substrate is a flexible substrate.

The conductive connection body comprises a material of metal.

The conductive connection body is set in a middle area of the substrate.

A frameless display device is formed in step (5) and is a top emission OLED display device.

The efficacy of the present invention is that the present invention provides a frameless display device and a manufacturing method thereof, in which a conductive connection body is formed on a substrate; a first via is formed in a protective layer to be located above the conductive connection body and a second via hole is formed in the substrate to be located under the conductive connection body. A circuit layout layer is connected through the first via with the conductive connection body and a flexible connection circuit connected to a drive circuit board is connected through the second via with the conductive connection body thereby achieving electrical connection between the drive circuit board and the circuit layout layer. The method is simple and easy to operate and in a frameless display device so manufactured, the flexible connection circuit and the drive circuit board are both arranged at a back side of the substrate without occupying an effective display zone thereby achieving frameless displaying and improving displaying quality.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
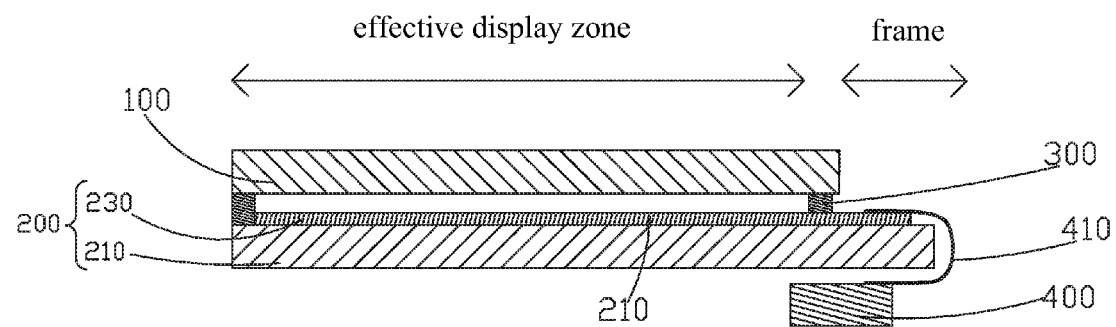
FIG. 1 is a schematic view of a conventional display device.
Figure 2:
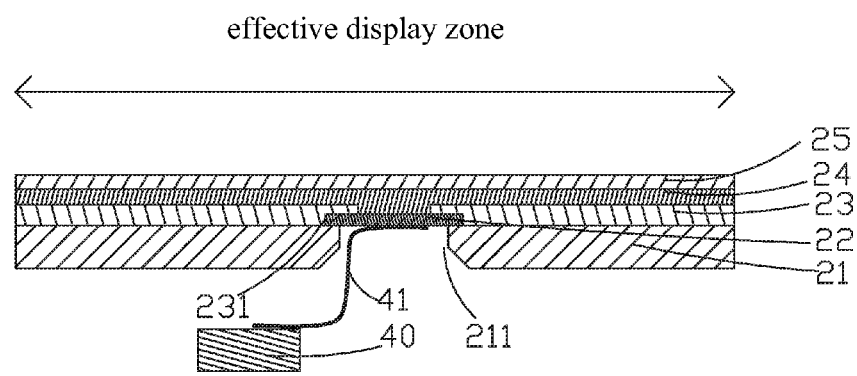
FIG. 2 is a schematic view showing a frameless display device according to the present invention.

Referring to FIG. 2, the present invention provides a frameless display device, which comprises a substrate 21, a conductive connection body 22 formed on the substrate 21, a protective layer 23 formed on the conductive connection body 22, a circuit layout layer 24 formed on the protective layer 23, an organic light emitting diode (OLED) emission layer or a package layer 25 formed on the circuit layout layer 24, and a drive circuit board 40 adjacent to a side of the substrate 21 that is distant from the conductive connection body 22 and is connected through a flexible connection circuit 41 with the conductive connection body 22;

the protective layer 23 comprises a first via 231 formed therein to be located above and correspond to the conductive connection body 22. The circuit layout layer 24 is set in engagement with and electrically connected to the conductive connection body 22 through the first via 231;

the substrate 21 comprises a second via 211 formed therein to be located under and correspond to the conductive connection body 22. The flexible connection circuit 41 has an end electrically connected to the drive circuit board 40 and an opposite end extending from the underside of the substrate 21 through the second via 211 to contact and electrically connect with the conductive connection body 22 so as to achieve electrical connection between the drive circuit board 40 and the circuit layout layer 24.

Specifically, the conductive connection body 22 is located at a middle area of the substrate 21.

Specifically, the substrate 21 is a flexible substrate and preferably, the substrate 21 is a plastic substrate.

Specifically, when the substrate 21 is a flexible substrate, the frameless display device provided in the present invention is a frameless flexible display device.

Specifically, the conductive connection body 22 comprises a metallic material, such as molybdenum, aluminum, copper, and silver.

Specifically, the protective layer 23 is an insulation layer or a planarization layer. When the protective layer 23 is an insulation layer, the insulation layer comprises a material of silicon oxide or silicon nitride; and when the protective layer 23 is a planarization layer, the planarization layer comprises a material of organic photoresist.

Preferably, the frameless display device in the present invention is a top-emission OLED display device.

The present invention provides a frameless display device, which when compared to the prior art, comprises a drive circuit board 40 and a flexible connection circuit 41 that are both arranged at the lower surface of a substrate 21 so that there is no need to provide an additional connection zone on a circuit layout layer 24 for connection with the flexible connection circuit 41 and the flexible connection circuit 41 is not necessarily set around an edge of the display device for connection with a circuit layout layer 24, thereby eliminating the necessity of a frame or bezel area and allowing an upper surface of a display device in the entirety thereof to serve as an effective display zone, providing a frameless display device.

Figure 3:
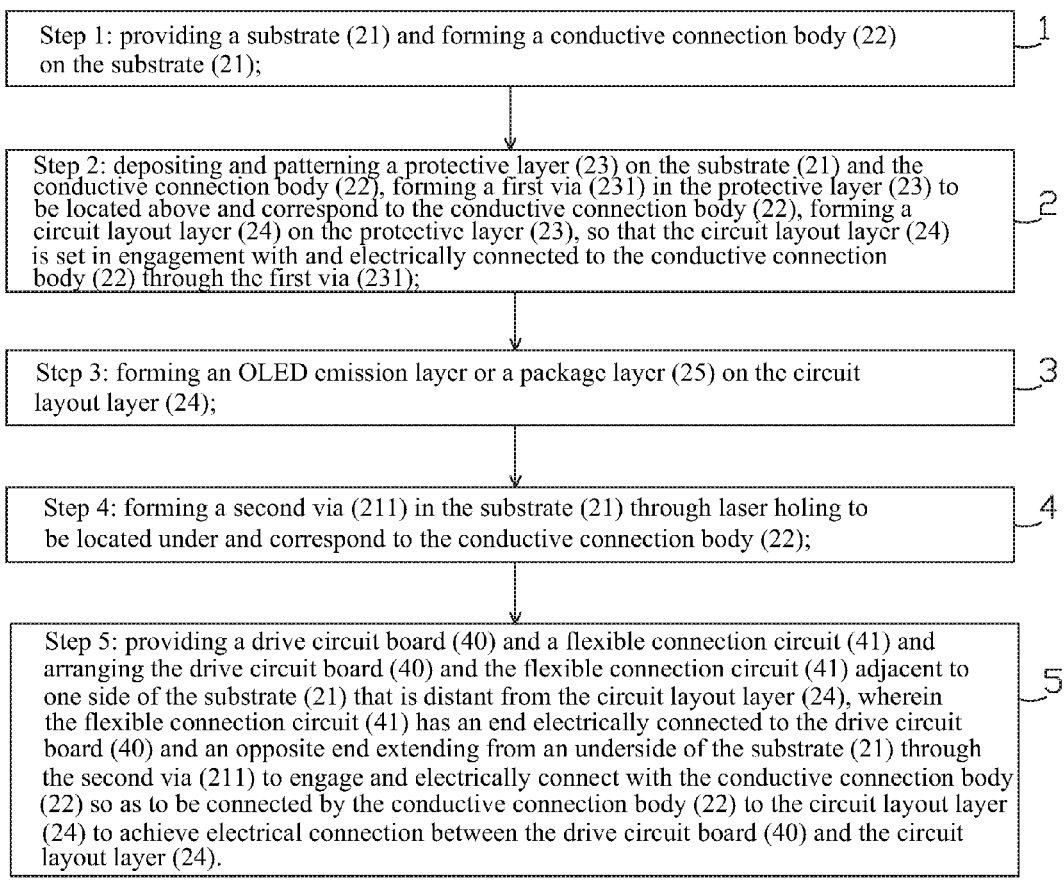
FIG. 3 is a flow chart illustrating a manufacturing method of a frameless display device according to the present invention.
Figure 4:
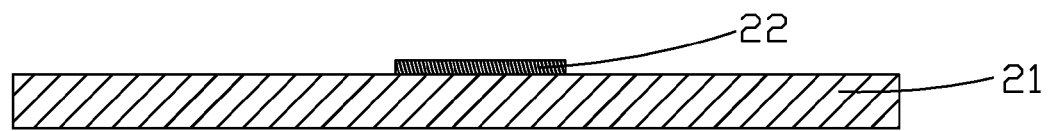
FIG. 4 is a schematic view illustrating a first step of the manufacturing method of the frameless display device according to the present invention.

Referring to FIG. 3, the present invention also provides a manufacturing method of a frameless display device, which comprises the following steps:

Step 1: as shown in FIG. 4, providing a substrate 21 and forming a conductive connection body 22 on the substrate 21.

Specifically, the substrate 21 is a flexible substrate and preferably, the substrate 21 is formed through coating.

Specifically, a process for forming the conductive connection body 22 is as follows: A conductive film is formed, through physical vapor deposition (PVD) on the substrate 21 and a photolithographic process is applied to pattern the conductive film so as to form a conductive connection body 22.

Specifically, the photolithographic process comprises operations of coating photoresist, exposure, development, wet etching, and photoresist removal.

Specifically, the conductive connection body 22 is located at a middle area of the substrate 21.

Specifically, the conductive connection body 22 comprises a metallic material, such as molybdenum, aluminum, copper, and silver.

Figure 5:
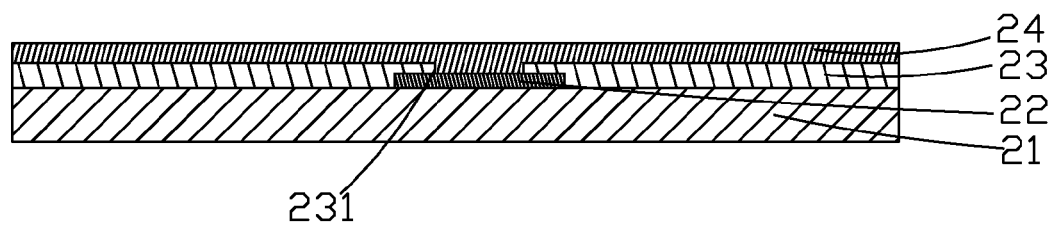
FIG. 5 is a schematic view illustrating a second step of the manufacturing method of the frameless display device according to the present invention.

Step 2: as shown in FIG. 5, depositing and patterning a protective layer 23 on the substrate 21 and the conductive connection body 22, forming a first via 231 in the protective layer 23 to be located above and correspond to the conductive connection body 22, forming a circuit layout layer 24 on the protective layer 23, so that the circuit layout layer 24 is set in engagement with and electrically connected to the conductive connection body 22 through the first via 231.

Specifically, the protective layer 23 is an insulation layer or a planarization layer. When the protective layer 23 is an insulation layer, the insulation layer comprises a material of silicon oxide or silicon nitride; and when the protective layer 23 is a planarization layer, the planarization layer comprises a material of organic photoresist.

Specifically, the circuit layout layer 24 comprises in-plane wiring or electrode.

Figure 6:
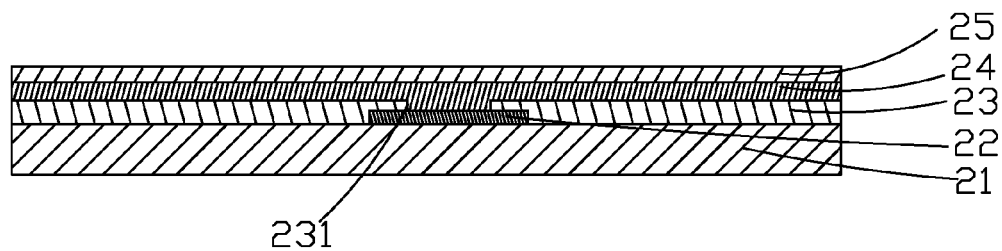
FIG. 6 is a schematic view illustrating a third step of the manufacturing method of the frameless display device according to the present invention.

Step 3: as shown in FIG. 6, forming an OLED emission layer or a package layer 25 on the circuit layout layer 24.

Figure 7:
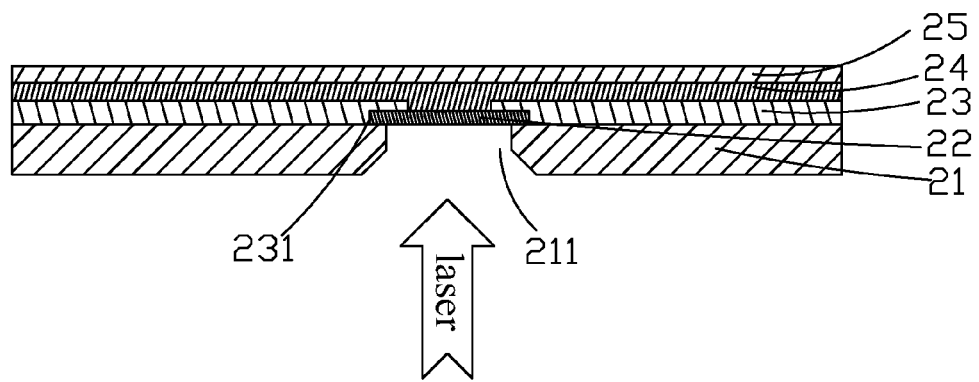
FIG. 7 is a schematic view illustrating a fourth step of the manufacturing method of the frameless display device according to the present invention.

Step 4: as shown in FIG. 7, forming a second via 211 in the substrate 21 through laser holing to be located under and correspond to the conductive connection body 22.

Step 5: providing a drive circuit board 40 and a flexible connection circuit 41 and arranging the drive circuit board 40 and the flexible connection circuit 41 adjacent to one side of the substrate 21 that is distant from the circuit layout layer 24, wherein the flexible connection circuit 41 has an end electrically connected to the drive circuit board 40 and an opposite end extending from an underside of the substrate 21 through the second via 211 to engage and electrically connect with the conductive connection body 22 so as to be connected by the conductive connection body 22 to the circuit layout layer 24 to achieve electrical connection between the drive circuit board 40 and the circuit layout layer 24 and forming a frameless display device as shown in FIG. 2.

The present invention provides a manufacturing method of a frameless display device, which comprises a conductive connection body 22 formed on a substrate 21 and a first via 231 formed in a protective layer 23 to be located above and correspond to the conductive connection body 22, a second via 211 formed in the substrate 21 to be located under the conductive connection body 22, so that a circuit layout layer 24 is connected through the first via 231 with the conductive connection body 22 and a flexible connection circuit 41 that is connected to the drive circuit board 40 is connected through the second via 211 with the conductive connection body 22 thereby achieving electrical connection between the drive circuit board 40 and the circuit layout layer 24. The method is simple and easy to operate and a frameless display device manufactured therewith allow the flexible connection circuit 41 and the drive circuit board 40 both located at a back side of the substrate 21 without occupying an effective display zone thereby achieving frameless displaying and improving displaying quality.

In summary, the present invention provides a frameless display device and a manufacturing method thereof, in which a conductive connection body is formed on a substrate; a first via is formed in a protective layer to be located above the conductive connection body and a second via hole is formed in the substrate to be located under the conductive connection body. A circuit layout layer is connected through the first via with the conductive connection body and a flexible connection circuit connected to a drive circuit board is connected through the second via with the conductive connection body thereby achieving electrical connection between the drive circuit board and the circuit layout layer. The method is simple and easy to operate and in a frameless display device so manufactured, the flexible connection circuit and the drive circuit board are both arranged at a back side of the substrate without occupying an effective display zone thereby achieving frameless displaying and improving displaying quality.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of a frameless display device, comprising the following steps:
   (1) providing a substrate and forming a conductive connection body on the substrate;
   (2) depositing and patterning a protective layer on the substrate and the conductive connection body, forming a first via in the protective layer to be located above and correspond to the conductive connection body, forming a circuit layout layer on the protective layer, so that the circuit layout layer is set in engagement with and electrically connected to the conductive connection body through the first via;

(3) forming an organic light emitting diode (OLED) emission layer or a package layer on the circuit layout layer;
(4) forming a second via in the substrate through laser holing to be located under and correspond to the conductive connection body; and
(5) providing a drive circuit board and a flexible connection circuit and arranging the drive circuit board and the flexible connection circuit adjacent to one side of the substrate that is distant from the circuit layout layer, wherein the flexible connection circuit has an end electrically connected to the drive circuit board and an opposite end extending from an underside of the substrate through the second via to engage and electrically connect with the conductive connection body so as to be connected by the conductive connection body to the circuit layout layer to achieve electrical connection between the drive circuit board and the circuit layout layer;

wherein the drive circuit board is separate from the substrate with spacing therebetween and the drive circuit board is connected by the flexible connection circuit that extends through the spacing and the second via to the conductive connection body formed on the substrate.

2. The manufacturing method of the frameless display device as claimed in claim 1, wherein the substrate is a flexible substrate.

3. The manufacturing method of the frameless display device as claimed in claim 1, wherein the conductive connection body comprises a material of metal.

4. The manufacturing method of the frameless display device as claimed in claim 1, wherein the conductive connection body is set in a middle area of the substrate.

5. The manufacturing method of the frameless display device as claimed in claim 4, wherein a frameless display device is formed in step (5) and is a top emission OLED display device.

* * * * *